United States Patent
Mitsuda

(10) Patent No.: US 7,248,078 B2
(45) Date of Patent: Jul. 24, 2007

(54) SEMICONDUCTOR DEVICE

(75) Inventor: Tsuyoshi Mitsuda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 79 days.

(21) Appl. No.: 11/206,045

(22) Filed: Aug. 18, 2005

(65) Prior Publication Data

US 2006/0038584 A1   Feb. 23, 2006

(30) Foreign Application Priority Data

Aug. 20, 2004   (JP)   ............................. 2004-240743

(51) Int. Cl.
*H03K 19/0175*   (2006.01)

(52) U.S. Cl. .......................................... 326/83; 326/27

(58) Field of Classification Search .................. 326/26, 326/27, 80–86
See application file for complete search history.

(56) References Cited

U.S. PATENT DOCUMENTS 6,661,260 B2 * 12/2003 Nakahara et al. ........... 327/109
7,170,732 B2 *  1/2007 Andersen et al. ............. 361/97
2003/0169025 A1 *  9/2003 Finney ....................... 323/276

FOREIGN PATENT DOCUMENTS

JP        2001-160746        6/2001

* cited by examiner

*Primary Examiner*—Don Le
(74) *Attorney, Agent, or Firm*—McGinn IP Law Group, PLLC

(57) ABSTRACT

The semiconductor device according to the present invention comprises an output MOS transistor M0, an MOS transistor M3 connected between a gate G1 of the output MOS transistor M0 and a ground voltage GND, a parasitic transistor Tr1 which is formed in parallel with the MOS transistor M3 with the substrate terminal of the MOS transistor M3 as a base, and a parasitic transistor control circuit for controlling the conducting status of the parasitic transistor Tr1 based on the power supply voltage Vcc.

16 Claims, 11 Drawing Sheets

SEMICONDUCTOR DEVICE

BACKGROUND OF THE INVENTION

1. Field of the Invention

The present invention relates to a semiconductor device, and more particularly to a semiconductor device having an over current protection circuit for protecting output transistors from an over current.

2. Description of the Related Art

In automobiles and home electric equipment, power devices (also called power ICs or power semiconductors), for controlling heavy current and high voltages, are being used. Power devices have the function of protecting output transistors from an over current, since an abnormal heavy current (over current) which flows into the output transistors due to such a failure as a load short circuit may breakdown the output transistors.

FIG. 14 and FIG. 15 are circuit diagrams depicting a configuration of a conventional power device. This conventional power device 101 is a switch for controlling the current which flows through the load 102, and this switch uses an MOSFET (Metal Oxide Semiconductor Field Effect Transistor, hereafter called MOS transistor). Since the switch is installed at a power supply (battery) side rather than a load, this is called a high side switch.

As FIG. 14 and FIG. 15 show, the conventional power device 101 comprises an output MOS transistor M110 for controlling the current of the load 102, a charge pump 103 for generating the gate voltage for turning ON the output MOS transistor M110, and the over current protection circuit 104 for protecting the output MOS transistor M110 from over current. The over current protection circuit 104 further comprises a detection circuit 105 for detecting an over current, and an MOS transistor M111 for discharging the gate charges of the output MOS transistor M110 when the detection circuit 105 detects an over current.

The battery to be the power supply is connected to the Vcc terminal (power supply terminal), the ground voltage GND is connected to the GND terminal (ground terminal), and the load 102 is connected to the OUT terminal.

For example, the output of the charge pump 103 is turned ON/OFF by a control signal from the outside, and the output MOS transistor M110 is turned ON/OFF by the output signal of the charge pump 103. When an over current is detected, the detection circuit 105 discharges the gate charges of the output MOS transistor M110 by turning ON the MOS transistor M111, and turns OFF the output MOS transistor M110, so as to prevent the output MOS transistor M110 from breakdown by an over current.

The power device 101 in FIG. 14 and the power device 101 in FIG. 15 are examples where the connection destination of the source of the MOS transistor M111 is different. The source of the MOS transistor M111 in FIG. 14 is connected to the GND terminal (ground terminal), and the source of the MOS transistor M111 in FIG. 15 is connected to the OUT terminal (output terminal). When the load is shorted, the OUT terminal is grounded to the ground voltage GND, so the power devices in FIG. 14 and FIG. 15 perform the same operation.

FIG. 16 is a timing chart when the load is shorted in a conventional power device. A short of the load means that the OUT terminal is grounded to the ground voltage GND, without passing through the load, by such a reason as a stripped insulating coating and a loose connector. If the load is shorted, the power supply voltage Vcc at the Vcc terminal drops to a level close to 0V of the ground voltage GND. This is because when the wire between the battery and the power device is long, the impedance of this wire becomes much higher than the ON resistance (several m—several tens mΩ) of the output MOS transistor, and if the load is shorted, most of the voltage of the battery is consumed by the wire.

Also the current is no longer consumed by the load, so the output current IOUT becomes abnormally heavy. Due to the over current, the output MOS transistor M110 heats up, and if the over current continues in this state, the output MOS transistor M110 breaks down by this heat. Therefore the output MOS transistor M110 must be turned OFF as quickly as possible.

However if the power supply voltage Vcc is extremely low, such as 0V, the over current protection circuit 104 cannot operate normally. For example, if the power supply voltage Vcc is the operating voltage of the detection circuit 105 or less, the over current cannot be detected, and if the power supply voltage Vcc is the threshold value of the MOS transistor M111 or less, the MOS transistor M111 does not turn ON, so the gate charges of the output MOS transistor M110 cannot be discharged. Therefore the output MOS transistor M110 cannot be turned OFF and the output MOS transistor M110 breaks down.

As a conventional semiconductor device having a circuit similar to FIG. 14 and FIG. 15, the one disclosed in Japanese Patent Application Laid-Open No. 2001-160746 is known.

As described above, in the case of a conventional semiconductor device, such as a power device, the output transistor cannot be turned OFF, and the output transistor breaks down if the power supply voltage is extremely low when an over current is generated.

SUMMARY OF THE INVENTION

A semiconductor device according to the present invention includes an output transistor connected between a first power supply terminal and an output terminal and passing an output current in accordance with a signal applied to a current control terminal thereof, an over current protection element connected between the current control terminal and a second power supply terminal, a first detection circuit applied with a voltage through the first power supply terminal, detecting a current flowing through the output transistor to provide a detection signal to a first control terminal of the over current protection element, and a second detection circuit applied with a voltage through the first power supply terminal, detecting a current flowing through the output transistor to provide a detection signal to a second control terminal of the over current protection element, and operating at a voltage lower than the first detection circuit.

According to the semiconductor device, when an over current flows in the output transistor, the second detection circuit detects the over current to cause the over current protection element to operate, and then the first detection circuit detects the over current to cause the over current protection element to operate. Thus, even when a power supply voltage is too low to operate the first detection circuit, the output transistor can be turned OFF with reliability, and dielectric breakdown of the output transistor is avoided.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Embodiment 1

The configuration of a system having the power device according to Embodiment 1 of the present invention will now be described. This system is a system installed in an automobile, for example, and is a system for controlling the current which flows through the load by the power device, and driving the load.

Figure 1:
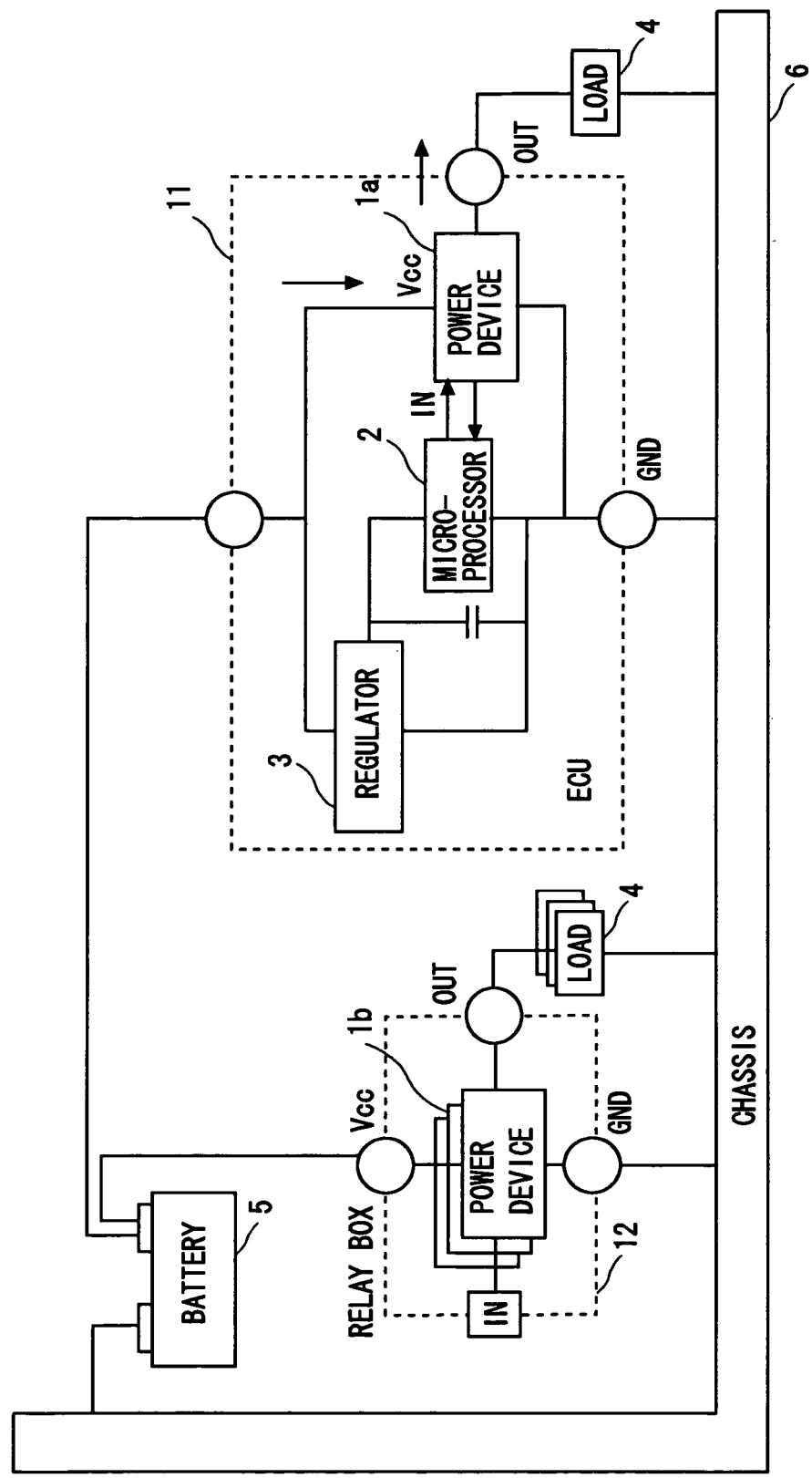
FIG. 1 is a block diagram depicting the system comprising a power device according to the present invention.

As FIG. 1 shows, this system comprises an ECU (Electric Control Unit) 11, relay box 12, load 4, battery 5 for supplying power, and a chassis 6 which is a metal part of the car body connected to the ground voltage GND (GND potential). The battery 5 and the ECU 11, and the battery 5 and the relay box 12 are connected by wires, such as a wire harness.

One end of the load 4 is connected to the power device 1a, and the other end is grounded to the chassis 6. The load 4 is head lights, power windows, ABS and engine valves, where the current is supplied from the power device 1a of the ECU 11 and the relay box 12, which operate based on this current.

The ECU 11 comprises the power device 1a, microprocessor 2 and regulator 3. The power device 1a, microprocessor 2 and regulator 3 are one-chip semiconductor devices respectively, for example, but may be comprised of an arbitrary number of chips.

Stable power, supplied from the regulator 3, operates the microprocessor 2. The microprocessor 2 is connected with the power device 1a so as to input/output signals to/from the power device 1a. The microprocessor 2 outputs a control signal for controlling the current of the load 4 to the power device 1a, and the abnormality signal 10, which indicates an abnormality status of the power device 1a, is input from the power device 1a.

The power device 1a is connected to the microprocessor 2 and the load 4. The power device 1a controls the current that flows through the load 4 according to a control signal which is input from the microprocessor 2. The power device 1a detects the abnormality status, such as an over current and over heating, and outputs an abnormality signal to the microprocessor 2. A plurality of power devices 1a may be installed in the ECU 11.

The relay box 12 is a box in which a plurality of switches are installed, and has only a plurality of power devices 1b, unlike the ECU 11. In this case, the plural power devices 1b control the current which flows through the plural loads 4 according to a control signal which is input from the outside.

In the case of a load which requires relatively moderate safety and simple control, such as head lights and power windows, the relay box 12 is used, and in the case of a load which requires high safety and complicated control, such as ABS control and engine control, the ECU 11 is used.

This system is not limited to an automobile, but may be a system driven by heavy current or heavy voltage, such as home electric equipment and robots. For example, this system has a configuration in which an over current is generated to the power device, and the power supply voltage drops when a failure, such as a load short, occurs.

Now the configuration of the power device according to the present embodiment will be described with reference to FIG. 2. This power device 1a is installed at the battery side rather than the load, and operates as a high side switch.

Figure 2:
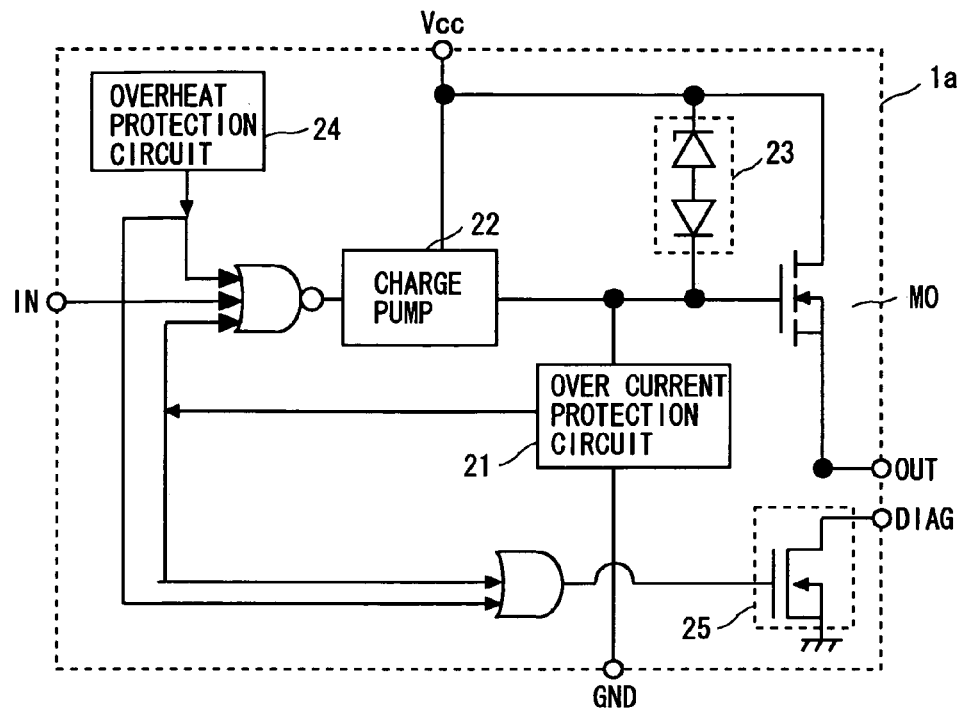
FIG. 2 is a block diagram depicting the power device according to the present invention.

As FIG. 2 shows, the power device 1a comprises an output MOS transistor (MOS transistor for output) M0, over current protection circuit 21, charge pump 22, clamp circuit 23, overheat protection circuit 24 and abnormality output circuit 25. In the power device 1a, the circuit outside the output MOS transistor M0 is called the control circuit. The power device 1a is not limited to this example, but may have other configurations, and in particular, an arbitrary configuration may be used for a portion other than the over current protection circuit, which will be described later in FIG. 3.

In the power device 1a, a control signal is input from the microprocessor 2 via the IN terminal (input terminal), and an abnormality signal is output to the microprocessor 2 via the DIAG (diagnosis) terminal. In the power device 1a, the power supply voltage Vcc (first power supply potential) is supplied from the battery 5 via the Vcc terminal (power supply terminal), and current is output to the load 4 via the OUT terminal (output terminal), and is grounded to the ground voltage GND (second power supply potential) via the GND terminal (ground terminal).

The output MOS transistor M0 is a switch for controlling the current which is output to the load 4. Generally MOS transistors are classified into a horizontal element where current flows in a direction parallel with the substrate face, and a vertical element where current flows in a vertical direction, depending on the structural differences. The vertical element, where one of the main electrodes is at the base side of the semiconductor element, excels in conducting capability per unit area compared with the horizontal element, and is mainly used as an element for handling high power. In this example, the vertical MOS transistor is used for the output MOS transistor M0, and the horizontal MOS transistor is used for the other MOS transistors, which will be described later.

The output MOS transistor M0 may be either an N-channel type or a P-channel type. In the case of a high side switch, a P-channel type can make a charge pump unnecessary and simplify circuits, but an N-channel type can increase drive capability and decrease chip size, so an N-channel type is preferable. In the following description, the output MOS transistor M0 is described as an N-channel type, but even if a P-channel type is used, the same operation is performed including the later mentioned MOS transistor M3 or second detection circuit 33, where only the polarity is reversed.

In the output MOS transistor M0, the drain is connected to the Vcc terminal, the gate is connected to the charge pump 22, and the source is connected to the OUT terminal. The output MOS transistor M0 turns ON/OFF based on the gate voltage which is output from the charge pump 22. For example, if the gate voltage is the threshold value or more, the output MOS transistor M0 turns ON and connects the Vcc terminal and the OUT terminal, and if the gate voltage is the threshold voltage or less, the output MOS transistor M0 turns OFF and disconnects the Vcc terminal and the OUT terminal.

The charge pump 22 is a circuit for increasing the power supply voltage Vcc to be supplied, and outputting the increased voltage as the gate voltage of the output MOS transistor M0. In the case of a high side switch, if an N-channel type MOS transistor is used for the output MOS transistor M0, the configuration of the source follower is formed, and the source voltage follows the gate voltage. Therefore if the gate voltage is insufficient, the output MOS transistor M0 does not sufficiently become ON status, and the desired drive capability cannot be acquired. So by supplying a sufficient voltage to the gate by the charge pump 22, the output MOS transistor M0 is turned ON without fail. For example, if the power supply voltage Vcc is 12V, then 22V, after a 10V increase, is supplied to the gate of the output MOS transistor M0. The charge pump 22 outputs the gate voltage at a high level or a low level according to a control signal, which is input from the microprocessor.

The clamp circuit 23 is a circuit for protecting the output MOS transistor M0 from the counter-electromotive voltage (negative voltage) generated by turning OFF, for example. The clamp circuit 23 comprises a Zener diode for withstanding voltage, and a diode for backflow prevention. If a counter-electromotive voltage is generated, the counter-electromotive voltage is clamped by the Zener diode, so as to prevent breakdown of the output MOS transistor M0.

The over current protection circuit 21 is a circuit for protecting the output MOS transistor M0 from the over current which is generated by a failure, such as a short of the load 4. When an over current is detected, the over current protection circuit 21 discharges the gate charges of the output MOS transistor M0, and stops the continuous flowing of over current by turning OFF the output MOS transistor M0. As mentioned later, the over current protection circuit 21 can turn OFF the output MOS transistor M0 without fail when an over current is generated, even if the power supply voltage Vcc drops radically.

The overheat protection circuit 24 is a circuit for protecting the output MOS transistor M0 from overheating. When the temperature of the output MOS transistor M0 reaches a predetermined temperature or more, the over heat protection circuit 24 stops the operation of the charge pump 22, and turns OFF the output MOS transistor M0.

Based on a signal which is input from the over current protection circuit 21 and the overheat protection circuit 24, the abnormality output circuit 25 outputs an abnormality signal from the DIAG terminal to the microprocessor 2.

Figure 3:
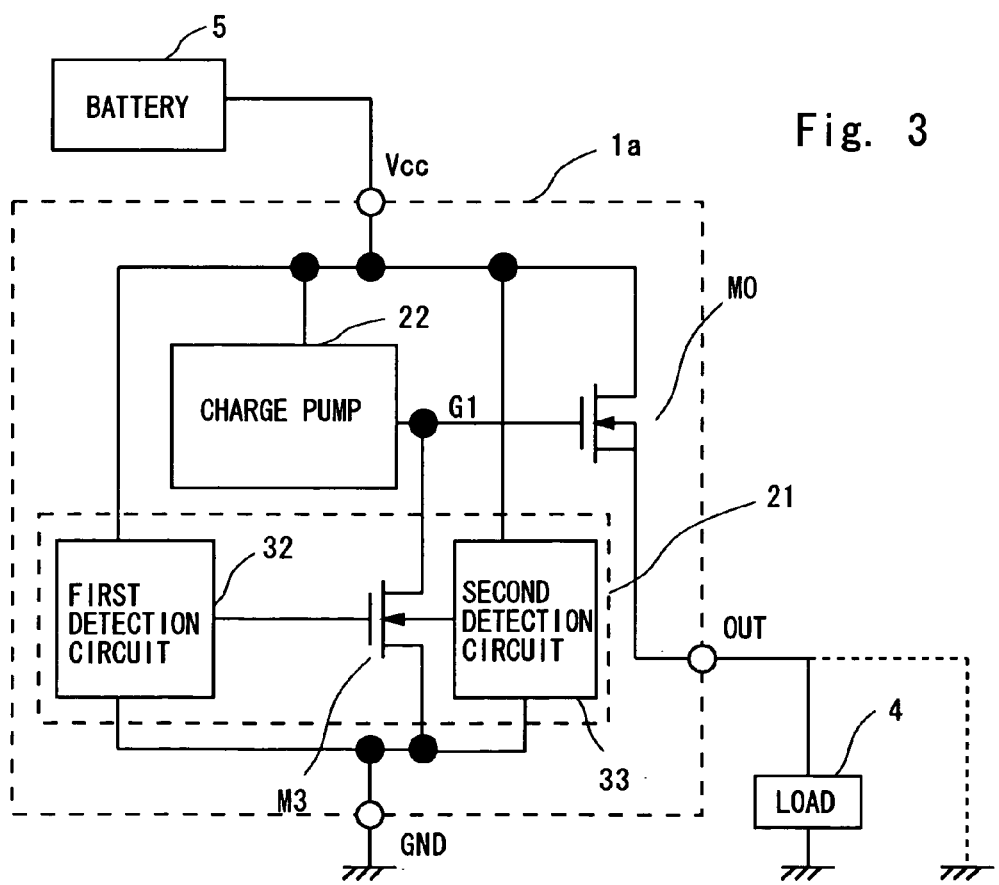
FIG. 3 is a circuit diagram depicting the power device according to the present invention.

Now the configuration of the over current protection circuit according to the present embodiment will be described with reference to FIG. 3 to FIG. 5. FIG. 3 shows the circuits around the output MOS transistor M0, the over current protection circuit 21 and the charge pump 22 of the power device 1a shown in FIG. 2. As FIG. 3 shows, the over current protection circuit 21 comprises a first detection circuit 32, the second detection circuit 33, and the MOS transistor M3.

The first detection circuit 32 and the second detection circuit 33 are circuits for detecting that the over current flows through the output MOS transistor M0, and outputting a control signal (detection signal) for controlling the discharge of the gate charges of the output MOS transistor M0 to the MOS transistor M3. The first detection circuit 32 detects current of the output MOS transistor M0 and outputs a detection signal to the gate (first control terminal) of the MOS transistor M3. The second detection circuit 33 detects current of the output MOS transistor M0 and outputs a detection signal to the back gate (second control terminal) of the MOS transistor M3. The second detection circuit 33 starts to operate at a voltage lower than that of the first detection circuit 32. The first detection circuit 32 includes a control circuit connected to the Vcc terminal, the GND terminal and the gate of the MOS transistor M3. For example, the control circuit detects the over current by monitoring the output current IOUT of the output MOS transistor M0, converting this monitor current into the monitor voltage, and comparing this monitor voltage with a predetermined reference voltage.

The MOS transistor M3 (first MOS transistor) is an over current protection element for protecting the output MOS transistor M0 from over current. The MOS transistor M3 is a circuit for discharging the charges of the gate G1 of the output MOS transistor M0 to the ground terminal (ground voltage GND) based on a detection signal which is output from the first detection circuit 32 and the second detection circuit 33. The MOS transistor M3 is connected between the gate G1 of the output MOS transistor M0 and the GND terminal. For example, when an OUT terminal is short-circuited to GND (GND potential) to cause an over current to flow through the output MOS transistor M0, the second detection circuit 33 outputs a detection signal to the MOS transistor M3 (parasitic transistor Tr1 as described later) to operate. In response to the detection signal, the MOS transistor M3 discharges accumulated charges at the gate G1 to shift the output transistor M0 to an off-state (non-operation state). Further, the shift to an off-state increases the potential of the Vcc terminal to let the first detection circuit 32 performs a detection operation. The first detection circuit 32 outputs a detection signal to the MOS transistor M3 to turn ON, resulting in the output transistor M0 which is brought into a full-OFF state.

Figure 4A:
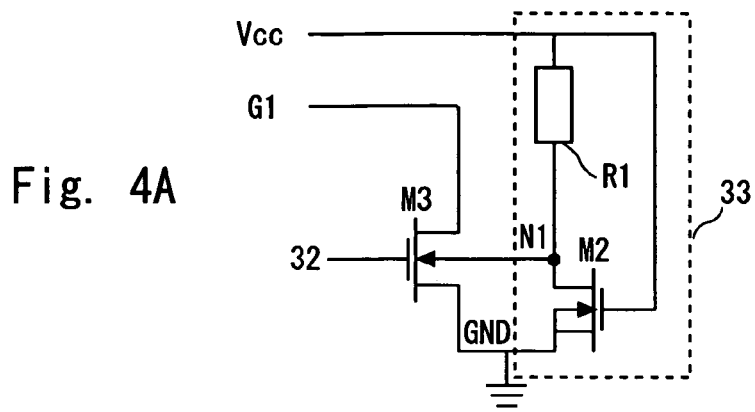
FIG. 4A and FIG. 4B are circuit diagrams depicting a second detection circuit according to the present invention.

FIG. 4A shows the configuration of the second detection circuit 33. As FIG. 4A shows, the second detection circuit 33 comprises the resistor R1 and MOS transistor M2 series-connected between the Vcc terminal and the GND terminal. In the resistor R1 (first resistance element), one end is connected to the Vcc terminal and the other end is connected to the drain of the MOS transistor M2 via the node N1 (series-connection node).

The MOS transistor M2 (second MOS transistor) is an N-channel type MOS transistor, for example, where the drain is connected to the node N1, the gate is connected to the Vcc terminal, and the source is connected to the GND terminal.

The MOS transistor M3 connected to the second detection circuit 33 is an N-channel type MOS transistor, for example, where the drain is connected to the gate G1 of the output MOS transistor M0, the gate is connected to the first detection circuit 32, the source is connected to the GND terminal, and the back gate (substrate terminal) is connected to the node N1.

Figure 4B:
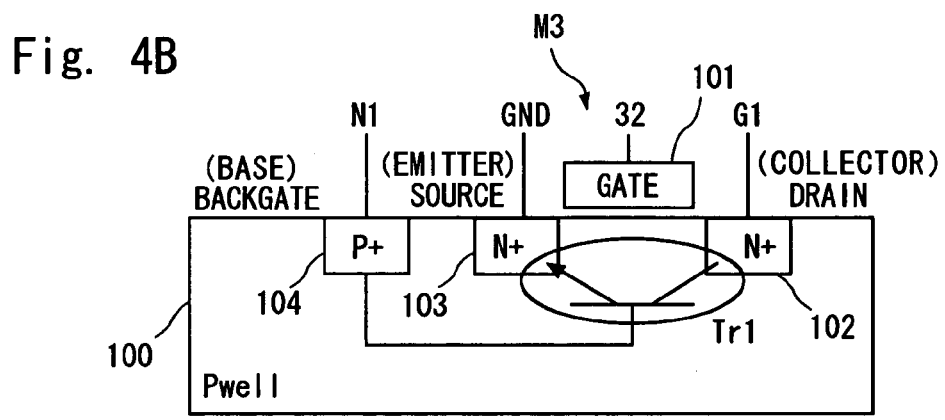

By connecting elements as shown in FIG. 4A, the parasitic transistor Tr1 becomes parasitic to the MOS transistor M3. If an over current flows through the output MOS transistor M0, the charges of the gate G1 of the output MOS transistor M0 are also discharged by this parasitic transistor Tr1. The control voltage for the parasitic transistor Tr1 to conduct is lower than the control voltage for the MOS transistor M3 to conduct. Therefore when an over current is generated, before the first detection circuit 32 operates and detects the over current, the second detection circuit 33 detects the over current to output a detection signal so that the parasitic transistor Tr1 conducts and discharges the charges at the gate G1. FIG. 4B is a cross-sectional view depicting a P-well 100 where the MOS transistor M3 is formed. In this example, the MOS transistor M3 is formed in the P-well 100, but may be formed in the P-substrate.

As FIG. 4B shows, a gate electrode 101 is formed on the P-well 100. An N+ drain region 102 and an N+ source region 103 are formed in the P-well 100 on both sides of the gate electrode 101. A P+ back gate region 104 is formed in the P-well in an area distant from the source region.

Therefore by the source region 103 (N+), back gate region 104 (P+) and drain region 102 (N+), the parasitic transistor Tr1, which is an NPN type bi-polar transistor, is constructed. The drain, source and back gate of the MOS transistor M3 correspond to the collector, emitter and base of the parasitic transistor Tr1 respectively. In other words, in the parasitic transistor Tr1, the collector is connected to the gate G1 of the output MOS transistor M0, the emitter is connected to the GND terminal, and the base is connected to the node N1.

Figure 4C:
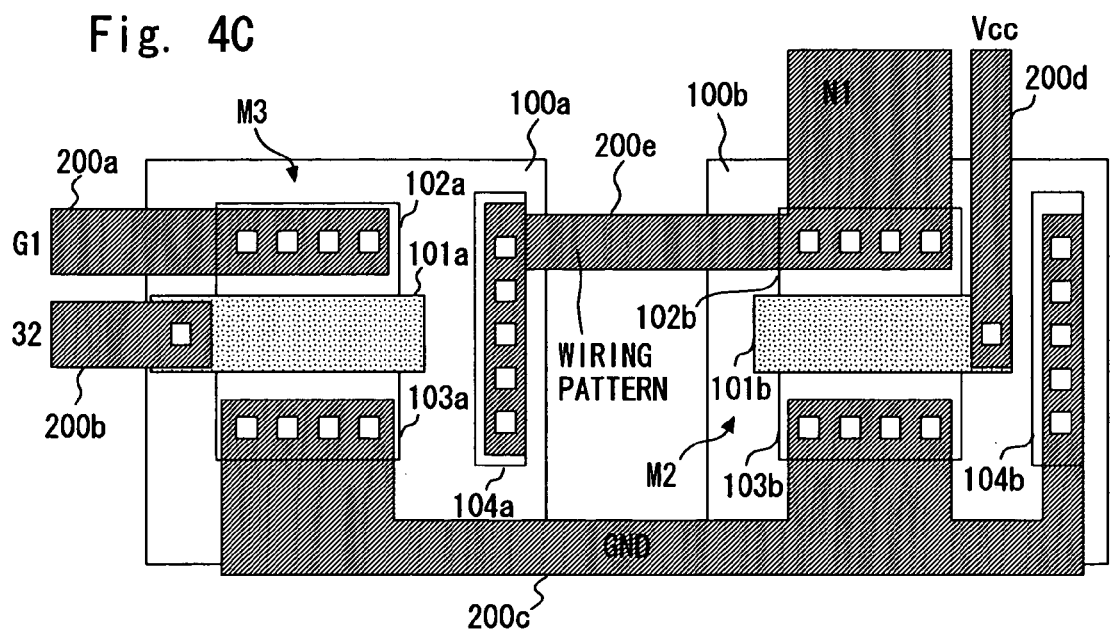
FIG. 4C is a plan view showing the semiconductor device according to the present invention.

For example, the MOS transistor M2 and the MOS transistor M3 are formed in different wells. FIG. 4C is a plan view showing the semiconductor device. In this semiconductor device, a P well 100a is located apart from a P well 100b.

Formed in the P well 100a are a gate electrode 101a, a drain region 102a, and a source region 103a of the MOS transistor M3. The gate electrode 101a is formed on the P well 100a, and the drain region 102a and the source region 103a are formed inside the P well 100a on both sides of the gate electrode 101a. A back gate region 104a is formed inside the P well 100a, apart from the gate electrode 101a, the drain region 102a, and the source region 103a.

Formed in the P well 100b are a gate electrode 101b, a drain region 102b, and a source region 103b of the MOS transistor M2. Similar to the P well 100a, the gate electrode 101b is formed on the P well 100b, and the drain region 102b, the source region 103b, and a back gate region 104b are formed inside the P well 100b.

A wiring pattern is formed on each of the P wells 100a and 100b. The wiring pattern is electrically connected with each gate electrode, drain region, source region, and back gate region through a contact. A wiring pattern 200a connects between a gate G1 and the drain region 102a. A wiring pattern 200b connects between the detection circuit 32 and the gate electrode 101a. A wiring pattern 200c connects among the source region 103a, the source region 103b, and the back gate region 104b. A wiring pattern 200d connects the Vcc terminal and the gate electrode 101b. A wiring pattern 200e connects between the back gate region 104a and the drain region 102b. The wiring patterns thus formed enable connection between the MOS transistor M3 and the MOS transistor M2 as shown in FIG. 4A, resulting in the parasitic transistor Tr1 on the MOS transistor M3 as shown in FIG. 4B.

Figure 5:
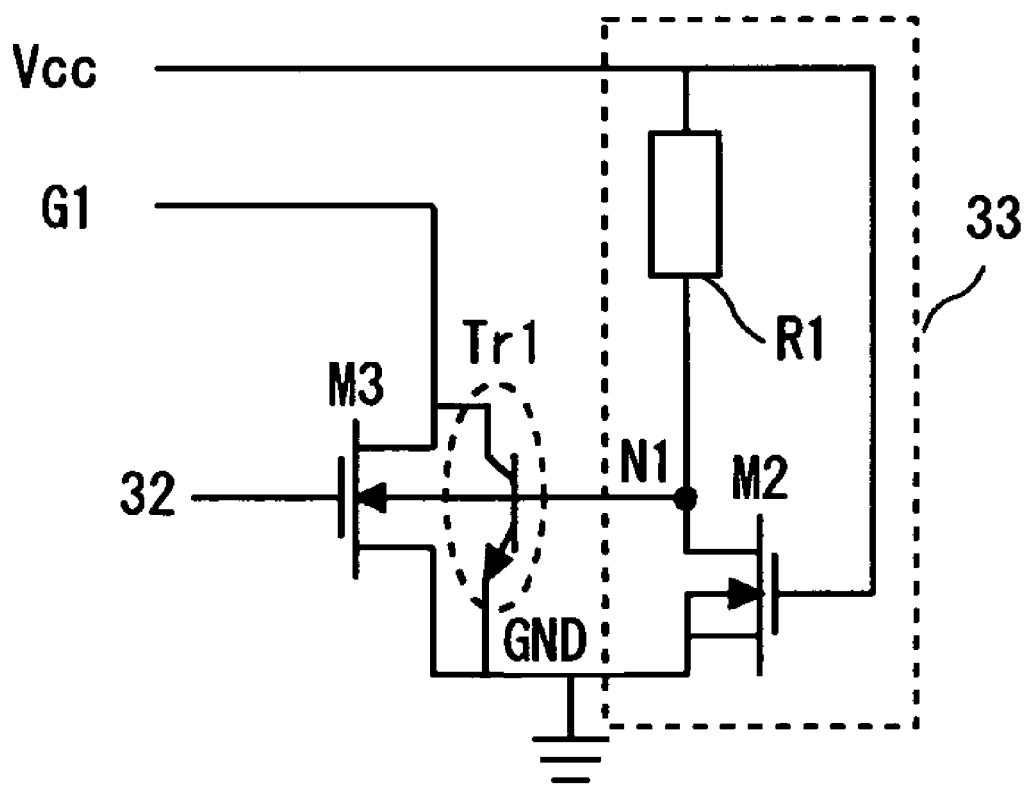
FIG. 5 is a circuit diagram depicting the second detection circuit according to the present invention.

FIG. 5 is a circuit diagram in FIG. 4A in which the parasitic transistor Tr1 is added. The configuration of the second detection circuit 33 will be described in more detail with reference to FIG. 5.

The resistor R1 and the MOS transistor M2 constitute the parasitic transistor control circuit for controlling the conducting status of the parasitic transistor Tr1 based on the power supply voltage Vcc, and the conducting status of the parasitic transistor Tr1 is controlled by the voltage of the node N1 between the resistor R1 and the MOS transistor M2.

The resistor R1 is an example of a resistance circuit having a predetermined impedance. The resistor R1 defines the voltage of the node N1, that is, the base-emitter voltage of the parasitic transistor Tr1. In other words, the resistor R1 is a pull-up resistor, which stabilizes the voltage of the node N1 when the MOS transistor M2 turns OFF at a voltage the same as the power supply voltage Vcc.

The MOS transistor M2 turns ON/OFF based on the power supply voltage Vcc, and changes the voltage of the node N1, so as to control the operation of the parasitic transistor. The MOS transistor M2 turns ON when the power supply voltage Vcc is the threshold value or more, sets the voltage of the node N1 to the ground voltage GND, and shuts OFF the bi-polar operation of the parasitic transistor Tr1. If the power supply voltage Vcc is the threshold value or less, the MOS transistor M2 turns OFF, sets the voltage of the node N1 to the power supply voltage Vcc, and starts (turns ON) the bi-polar operation of the parasitic transistor Tr1 according to the power supply voltage Vcc.

The MOS transistor M3 performs the ON/OFF operation based on the current value which flows through the output MOS transistor M0. In other words, when the first detection circuit 32 detects an over current, the MOS transistor M3 discharges the charges of the gate G1 of the output MOS transistor M0 to the ground voltage GND. The MOS transistor M3 changes the gate voltage G1 to the ground voltage GND according to the control of the first detection circuit 32. For example, if the control signal from the first detection circuit 32 is the threshold value or more, the MOS transistor M3 turns ON and discharges the charges of the gate G1, and if the control signal from the first detection circuit 32 is the threshold value or less, the MOS transistor M3 turns OFF and does not discharge the charges of the gate G1.

When an over current is generated and the power supply voltage Vcc is in low status, the parasitic transistor Tr1 discharges the charges of the gate G1 of the output MOS transistor M0 to the ground voltage GND. In other words, the parasitic transistor Tr1 changes the gate voltage G1 to the ground voltage GND according to the parasitic transistor control circuit, such as the MOS transistor M2. If the base current is flowing when the voltage of the node N1 is a predetermined base-emitter voltage (bi-polar operation voltage) or more, the parasitic transistor Tr1 turns ON and conducts the collector-emitter, and discharges the charges of the gate G1. If the base current is not flowing when the voltage of the node N1 is a predetermined base-emitter voltage (bi-polar operation voltage) or less, the connection of the collector-emitter is shut OFF, and the parasitic transistor Tr1 turns OFF and the charges of the gate G1 are not discharged.

The operation voltage for the parasitic transistor Tr1 to perform bi-polar operation and to conduct is a voltage lower than the threshold value (voltage required to conduct) of the MOS transistors M2 and M3 or the operation voltage for the detection circuit 105 to perform the over current detection operation, which is 0.6V, for example. Generally in a power device, it is difficult to form a transistor with a low threshold value, because, for example, the gate electrode becomes a thick oxide film for the high power. So in the present embodiment, the low voltage operation is enabled by a parasitic transistor which is parasitic to the MOS transistor, and not by an MOS transistor. The second detection circuit 33 is operable at a voltage lower than the first detection circuit 32.

Figure 6:
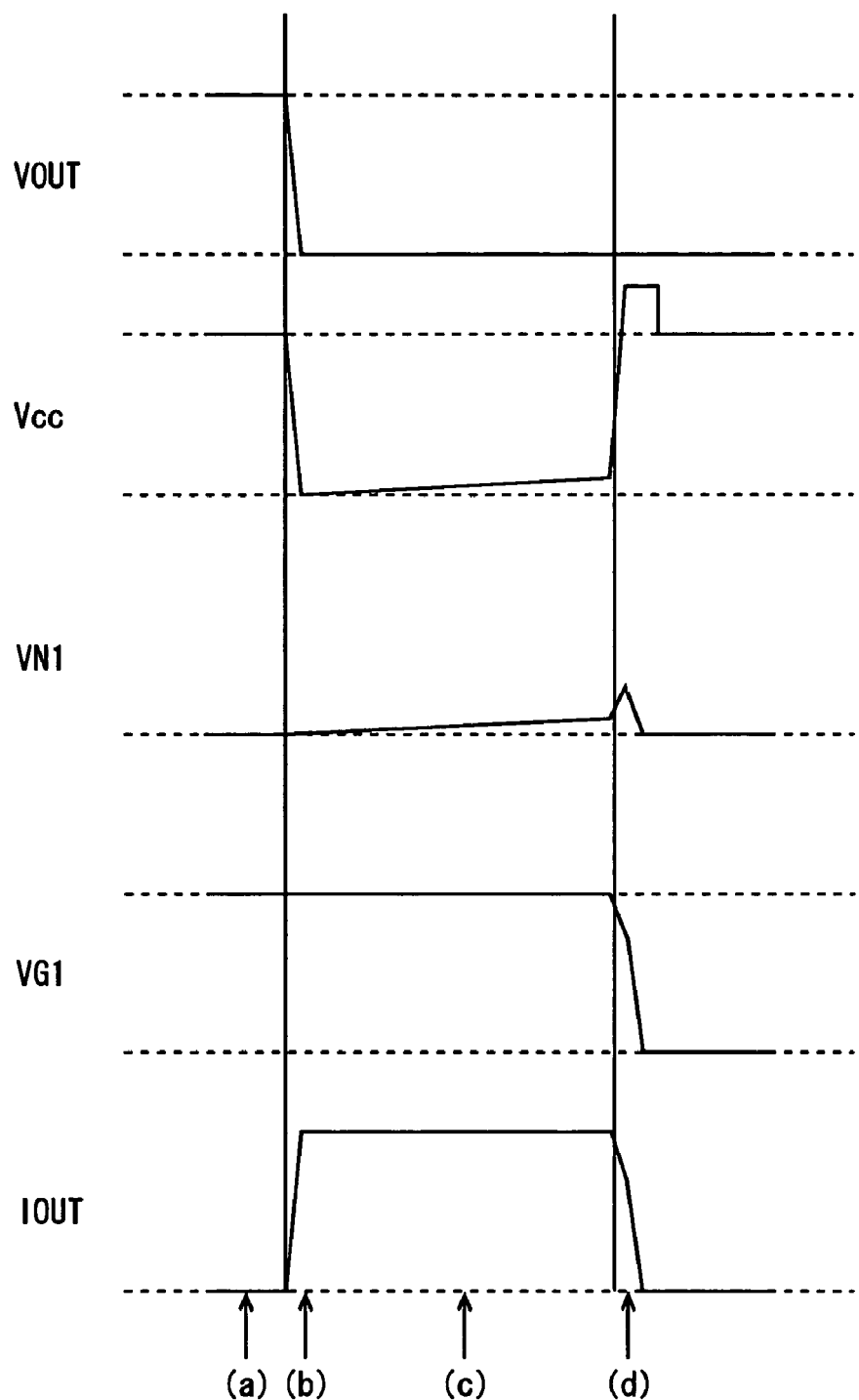
FIG. 6 is a timing chart depicting the power device according to the present invention.

Now the operation of the power device according to the present embodiment will be described with reference to FIG. 6. FIG. 6 is a timing chart when the load is shorted in the power device 1a, and shows the waveform of the output voltage VOUT at the OUT terminal, the power supply voltage Vcc at the Vcc terminal, the node voltage VN1 at the node N1 of the second detection circuit 33, the gate voltage VG1 at the gate G1 of the output MOS transistor M0, and the output current IOUT at the OUT terminal.

In normal operation before a load is shorted, the waveform is the one shown in FIG. 6(a). For example, it is assumed that the charge pump 22 outputs high level and the output MOS transistor M0 is ON. At this time, most of the voltage is consumed by the load 4, so the output voltage VOUT roughly becomes the level of the voltage of the battery 5. Since the output MOS transistor M0 is ON and the ON resistance of the output MOS transistor is several m—several tens mΩ, the power supply voltage Vcc becomes a voltage roughly the same as the output voltage VOUT. The MOS transistor M2 is ON because of the power supply voltage Vcc, so the node voltage VN1 roughly becomes 0V, which is the ground voltage GND.

Since the node voltage VN1 is 0V, the parasitic transistor Tr1 does not perform the bi-polar operation. An over current is not generated, so the first detection circuit 32 does not detect an over current, and the MOS transistor M3 is OFF. Therefore the gate voltage VG1 becomes a high level voltage, which is the output from the charge pump 22. The output current IOUT is current which flows through the load 4, and becomes a predetermined current according to the load 4.

Immediately after a load is shorted, the waveform becomes as shown in FIG. 6(b). When the load 4 is shorted and the output terminal OUT is grounded to the ground voltage GND, the voltage is consumed by the impedance of the wire between the battery 5 and the Vcc terminal. If the ON resistance of the output MOS transistor M0 is 0, with respect to the impedance of the wire between the battery 5 and the Vcc terminal, the output voltage VOUT drops nearly to 0V. Since the output MOS transistor M0 is ON, the power supply voltage Vcc drops nearly to 0V, just like the output voltage VOUT.

If the power supply voltage Vcc drops to the threshold value of the MOS transistor M2 or less, the MOS transistor M2 turns OFF. When the MOS transistor M2 turns OFF, current does not flow through the node N1, so the node voltage VN1 remains around 0V, just like the power supply voltage Vcc.

Since the node voltage VN1 remains around 0V, the parasitic transistor Tr1 does not perform bi-polar operation. The power supply voltage Vcc has been dropped roughly to 0V, so the first detection circuit 32 cannot operate, and the MOS transistor M3 is OFF. Therefore the gate voltage VG1 remains at the high level voltage which is output from the charge pump 22. And in the output current IOUT, the load is shorted and current is no longer consumed thereby, so an over current starts to flow.

After FIG. 6(b), the waveform becomes as shown in FIG. 6(c). Since the over current continues to flow through the output MOS transistor M0, the temperature starts to rise. Because the temperature rises, the resistance value of the ON resistance of the output MOS transistor M0 increases. And since the same current flows even if the ON resistance increases, the power supply voltage Vcc rises as the ON resistance rises.

The node voltage VN1 becomes a voltage roughly the same as the power supply voltage Vcc by the resistor R1, because the MOS transistor M2 is OFF. Therefore if the power supply voltage Vcc rises, the node voltage VN1 also rises.

After FIG. 6(c), the waveform becomes as shown in FIG. 6(d). Since the node voltage VN1 is the base-emitter voltage of the parasitic transistor Tr1, the base current flows when the node voltage VN1 rises to a predetermined voltage, the transistor Tr1 starts the bi-polar operation, and collector current flows. A period from the short-circuit of a load until the bi-polar operation is short enough for the output MOS transistor M0 to withstand the over current, and an experimental example of the period is 800 μs or shorter. Therefore the charges of the gate G1 of the output MOS transistor M0 are discharged to the ground voltage GND by the parasitic transistor Tr1, and the gate voltage VG1 starts to drop. That is, when the second detection circuit 33 detects the over current and outputs a detection signal upon the generation of the over current, the parasitic transistor Tr1 conducts, charges of the gate G1 are discharged, and the output MOS transistor M0 starts shifting to an off-state (non-operation state).

When the gate voltage VG1 drops, the output MOS transistor M0 starts transiting to OFF, so the output current IOUT also starts to drop. Then the ON resistance of the output MOS transistor M0 further increases, which further increases the power supply voltage Vcc. The wire between the battery 5 and the Vcc terminal has a high inductance component as well as a high impedance component, so a counter-electromotive voltage is applied if the current changes. Therefore as the output current IOUT drops, the power supply voltage Vcc rapidly rises to a voltage higher than the normal voltage.

When the power supply voltage Vcc rises to the threshold value of the MOS transistor M2 or more, the MOS transistor M2 turns ON. Therefore current flows from the node N1 to the ground voltage GND, and the node voltage VN1 drops roughly to 0V. In the parasitic transistor Tr1, the base-emitter voltage drops, the base current no longer flows, and the bi-polar operation stops. This stops the discharge of the charges of the gate G1 by the parasitic transistor Tr1.

When the power supply voltage Vcc further rises up to the operation voltage of the first detection circuit 32, the operation of the first detection circuit 32 recovers, and the monitoring of the output current IOUT becomes possible. Then the first detection circuit 32 detects that the output current IOUT is in an over current state, and outputs the control signal to the MOS transistor M3. By this control signal, the MOS transistor M3 turns ON. In other words, in the first half of FIG. 6(d), the charges of the gate G1 are discharged by the parasitic transistor Tr1, and in the latter half of FIG. 6(d), the charges of the gate G1 are discharged by the MOS transistor M3.

By the MOS transistor M3 turning ON, the gate voltage VG1 drops nearly to 0V. This makes the output MOS transistor M0 turn OFF and drops the output current IOUT to 0V. In this way, the output MOS transistor M0 is turned OFF when an over current is generated by a short of the load.

By discharging the gate charges of the output MOS transistor using the parasitic transistor in this configuration, the output MOS transistor can be turned OFF and the output MOS transistor can be protected from breakdown by an over current. Since the parasitic transistor is used, the output MOS transistor can be turned OFF even if the power supply voltage Vcc drops radically and the control circuit, such as the detection circuit, can no longer operate.

When the power supply voltage recovers to the voltage with which the control circuit can operate, the operation of the parasitic transistor is stopped, and the protection operation is performed by the control circuit, so the output MOS transistor can be efficiently protected.

Also an increase of the circuit area can be prevented by constructing such that the parasitic transistor is parasitic to the MOS transistor for gate discharge, which conventionally has been used as the over current protection circuit.

Embodiment 2

The power device according to Embodiment 2 of the present invention will now be described. In the power device of the present embodiment, only the configuration of the second detection circuit 33 in FIG. 5 is different from Embodiment 1, and the other areas are the same as Embodiment 1, so primarily the second detection circuit 33 will be described.

Figure 7:
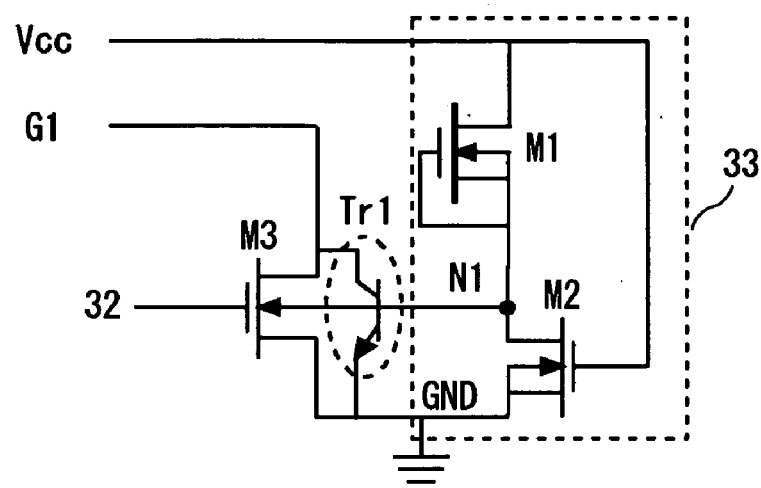
FIG. 7 is a circuit diagram depicting the second detection circuit according to the present invention.

FIG. 7 is a circuit diagram depicting the configuration of the second detection circuit 33 according to the present embodiment. In FIG. 7, composing elements the same as FIG. 5 are denoted with the same reference symbols, and description thereof will be omitted. The operation of the power device using the second detection circuit 33 is the same as FIG. 6.

The second detection circuit 33 of the present embodiment comprises the depletion MOS transistor M1, instead of the resistor R1 in FIG. 5. In the depletion MOS transistor M1, the drain is connected to the Vcc terminal, the gate is connected to the source, and the source is connected to the node N1.

The depletion MOS transistor M1 is an N-channel type and a depletion type MOS transistor, and has impedance components just like the resistor R1. Any circuit can be used here if the circuit has an impedance component and pulls up the potential of the N1 to the power supply voltage Vcc, such as the depletion MOS transistor M1 and the resistor R1.

The depletion MOS transistor M1 is a depletion type, and has a characteristic to flow a constant drain current in a saturated region, regardless the drain-source voltage. The depletion MOS transistor M1 can decrease the area of an element, compared with the resistor R1.

By this configuration, the output MOS transistor is protected from an over current using a parasitic transistor, and a circuit area can be decreased more than Embodiment 1 by replacing the resistor with a depletion MOS transistor.

Embodiment 3

The above embodiments describe en example where the ON resistance of the output MOS transistor is so small as to be insignificant relative to the impedance of the wiring between the battery and the Vcc terminal, so the voltage of the Vcc terminal immediately after the short-circuit drops down to about 0V. The following embodiments describe an example where the output MOS transistor has a non-negligible amount of ON resistance, so the voltage of a Vcc terminal just after the short-circuit does not drop down to a threshold voltage of the MOS transistor M2 or lower, which prevents the transistor M2 from turning off, and inhibits the operation of the parasitic transistor Tr.

A power device according to Embodiment 3 of the present invention will now be described. In the power device of the present embodiment, only the configuration of the second detection circuit 33 in FIG. 5 is different from Embodiment 1, and the other areas are the same as Embodiment 1, so primarily the second detection circuit 33 will be described.

Figure 9:
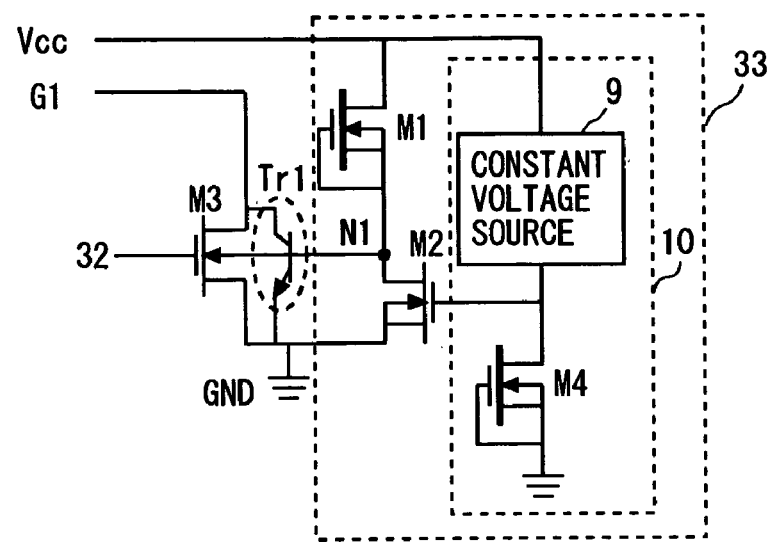
FIG. 9 is a circuit diagram depicting the second detection circuit according to the present invention.

FIG. 9 is a circuit diagram depicting the configuration of the second detection circuit 33 according to the present embodiment. In FIG. 9, composing elements the same as FIG. 5 and FIG. 7 are denoted with the same reference symbols, and description thereof will be omitted. The operation of the power device using the second detection circuit 33 is the same as FIG. 6.

The second detection circuit 33 of the present embodiment comprises a circuit for adjusting the voltage by which the MOS transistor M2 turns ON/OFF, that is, a gate discharge voltage adjustment circuit (control voltage adjustment circuit) 10 for adjusting the control voltage for the parasitic transistor Tr1 to perform gate discharge, in addition to the configuration in FIG. 7.

The gate discharge voltage adjustment circuit 10 comprises the constant voltage source 9 and the depletion MOS transistor M4.

Figure 10A:
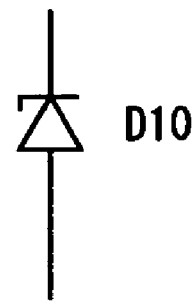
FIG. 10A–FIG. 10D are circuit diagrams depicting a constant voltage source used for the second detection circuit according to the present invention.
Figure 10B:
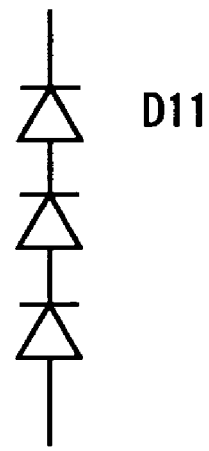

The constant voltage source 9 is a circuit or element for generating the constant voltage, and the configuration thereof is arbitrary. For example, the constant voltage source 9 can be constructed as shown in FIG. 10A–D. FIG. 10A is an example using the Zener diode D10. FIG. 10B is an example when a plurality of diodes D11 are connected in series.

Figure 10C:
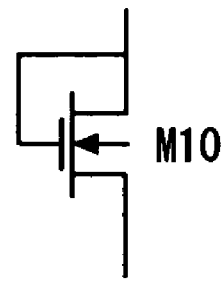
Figure 10D:
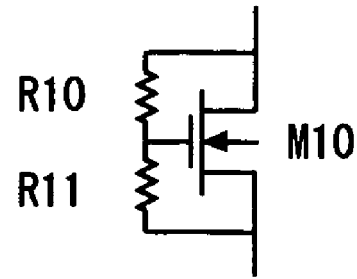

FIG. 10C is an example when the diode-connected MOS transistor M10 is used. The MOS transistor M10 is an N-channel type MOS transistor, where the gate and the source are connected. FIG. 10D is an example when the MOS transistor M10 and the resistors R10 and R11 are used. The resistor R10 is connected between the drain and gate of the MOS transistor M10, and the resistor R11 is connected between the gate and source of the MOS transistor M10. These resistors R10 and R11 can adjust the voltage to be generated.

The depletion MOS transistor M4 (second resistance element) in FIG. 9 is an N-channel type and depletion type MOS transistor. The depletion MOS transistor M4 is an example of a circuit having a resistance component, just like the depletion MOS transistor M1, and a resistor itself may be used.

The depletion MOS transistor M4 is installed between the Vcc terminal and the gate of the MOS transistor M2, and the drain is connected to the constant voltage source 9 and the gate of the MOS transistor M2, the gate is connected to the source, and the source is grounded to the ground voltage GND.

In Embodiment 1, the power device turns OFF when the power supply voltage Vcc drops to the threshold value of the MOS transistor M2 or less, and turns ON when the power supply voltage Vcc rises to the threshold value or more, as described in FIG. 6.

In the present embodiment, the power device turns OFF when the power supply voltage Vcc is the sum of the voltage of the constant voltage source 9 and the threshold value of the MOS transistor M2 or less, and turns ON when the power supply voltage Vcc is the sum of the voltage of the constant voltage source 9 and threshold value of the MOS transistor M2 or more. In other words, the parasitic transistor Tr1 can start bi-polar operation when the power supply voltage Vcc drops to the sum of the voltage of the constant voltage source 9 and threshold value of the MOS transistor M2 or less.

The power supply voltage Vcc, when the load is shorted, is determined by the ratio of the wire impedance between the battery 5 and the Vcc terminal and the impedance of the ON resistance of the output MOS transistor M0. When the ratio of the wire impedance between the battery 5 and the Vcc terminal and the impedance of the ON resistance of the output MOS transistor M0 is 3:1, the power supply voltage Vcc is 3V if the battery 5 is 12V. If the threshold value of the MOS transistor M2 at this time is 2V, the MOS transistor M2 does not turn OFF in the configuration of Embodiment 1, since the power supply voltage Vcc is 3V. Therefore the parasitic transistor Tr1 cannot be operated. According to the present embodiment, the sum of the voltage of the constant voltage source 9 and the threshold value of the MOS transistor M2 is 3V if the voltage of the constant voltage source 9 is 1V, so the MOS transistor M2 turns OFF, and the parasitic transistor Tr1 can be operated.

By this configuration when the gate discharge voltage adjustment circuit is installed, the power supply voltage Vcc for the parasitic transistor to perform gate discharge can be adjusted, so the parasitic transistor can be operated without fail according to the power supply voltage Vcc when an over current is generated, and the output MOS transistor can be protected from an over current.

Embodiment 4

A power device according to Embodiment 4 of the present invention will now be described. In the power device of the present embodiment, only the configuration of the second detection circuit 33 in FIG. 5 is different from Embodiment 1, and the other areas are the same as Embodiment 1, so primarily the second detection circuit 33 will be described.

Figure 11:
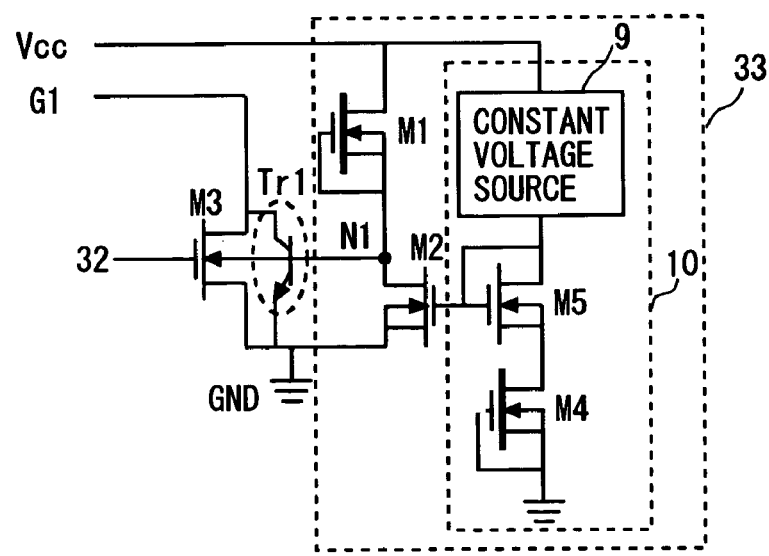
FIG. 11 is a circuit diagram depicting the second detection circuit according to the present invention.

FIG. 11 is a circuit diagram depicting the configuration of the second detection circuit 33 according to the present embodiment. In FIG. 11, composing elements the same as FIG. 5 and FIG. 9 are denoted with the same reference symbols, and description thereof will be omitted. The operation of the power device using the second detection circuit 33 is the same as FIG. 6.

The second detection circuit 33 of the present embodiment is the gate discharge voltage adjustment circuit 10 in FIG. 9, further comprising the MOS transistor M5 between the constant voltage source 9 and the MOS transistor M4.

The MOS transistor M5 (fourth MOS transistor) is an N-channel type MOS transistor, where the drain is connected to the constant voltage source 9 and also to the gate, the gate is connected to the gate of the MOS transistor M2, and the source is connected to the drain of the MOS transistor M4. In other words, the MOS transistor M5 and the MOS transistor M2 form a current mirrored configuration, and current the same as the MOS transistor M5 flows into the MOS transistor M2.

In Embodiment 3, the power supply voltage Vcc, for discharge to occur in the gate G1, is greatly influenced by the change of the threshold value of the MOS transistor M2, and this threshold value disperses because of the manufacturing process. For example, as the threshold value increases, the voltage at which the MOS transistor M2 turns OFF and the parasitic transistor Tr1 operates increases, and as the threshold value decreases, the voltage at which the MOS transistor M2 turns OFF and the parasitic transistor Tr1 operates decreases.

In the present embodiment, the MOS transistor M5 is an MOS transistor having the same structure (size, dimensions) as the MOS transistor M2, so the influence of the dispersion of the threshold value can be decreased. For example, the MOS transistor M5 and the MOS transistor M2 can be MOS transistors having roughly the same structure by creating them with the same process.

By this configuration, the gate discharge voltage adjustment circuit can adjust the power supply voltage Vcc at which the parasitic transistor performs gate discharge, and by installing the MOS transistor having the same structure as the MOS transistor for controlling the operation of the parasitic transistor, the parasitic transistor can be accurately operated without being subject to the influence of manufacturing dispersion, and the output MOS transistor can be protected from an over current.

Embodiment 5

A power device according to Embodiment 5 of the present invention will now be described. In the power device of the present embodiment, only the configuration of the second detection circuit 33 in FIG. 3 and FIG. 5 is different from Embodiment 1, and the other areas are the same as Embodiment 1, so primarily the second detection circuit 33 will be described.

Figure 12:
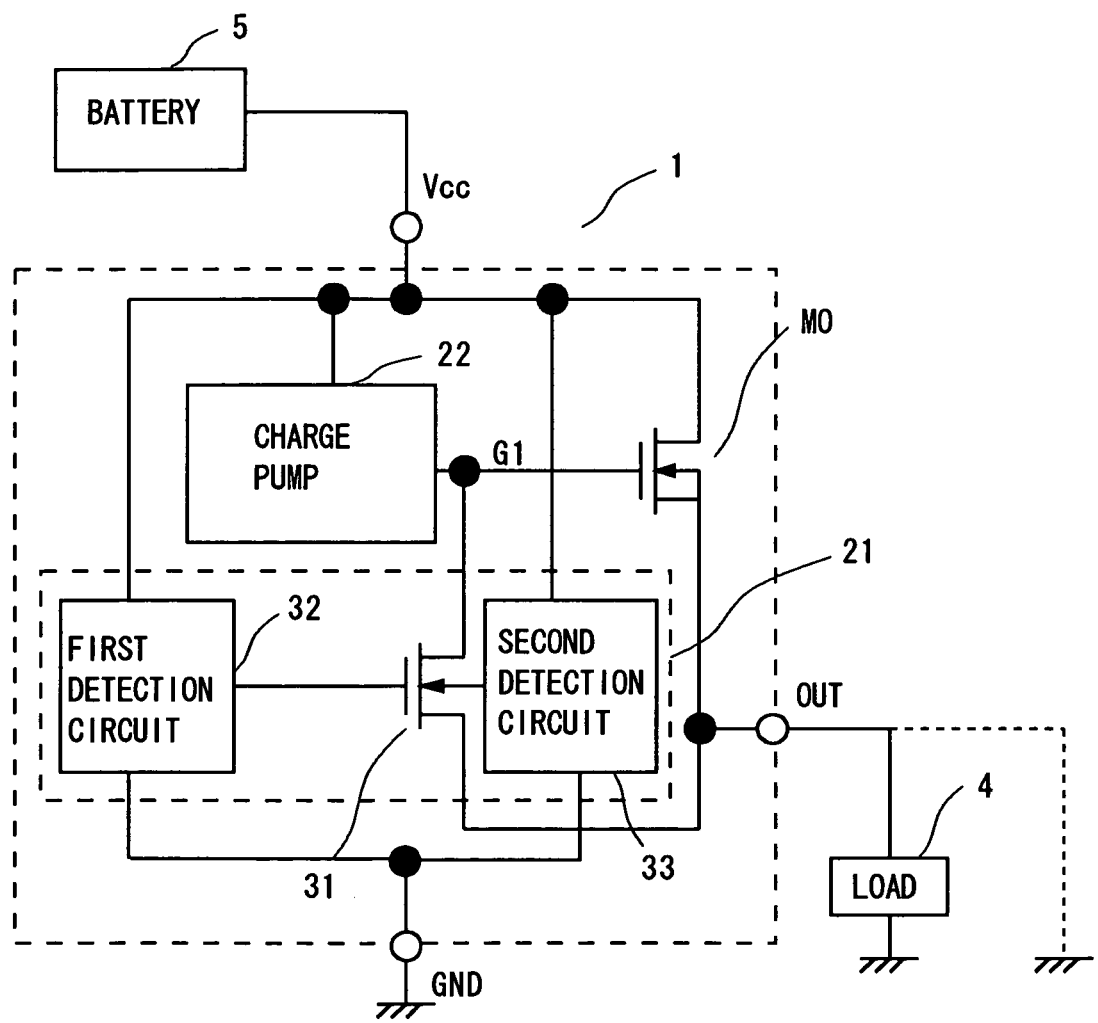
FIG. 12 is circuit diagram depicting the power device according to the present invention.

FIG. 12 shows circuits around the MOS transistor M0, the over current protection circuit 21 and the charge pump 22 of the power device according to the present embodiment. In FIG. 12, composing elements the same as FIG. 3 are denoted with the same reference symbols, and description thereof will be omitted.

The MOS transistor M3 in FIG. 3 is installed between the gate G1 and the GND terminal, but the MOS transistor M3 of the present embodiment is installed between the gate G1 and the OUT terminal. When an over current is generated, the MOS transistor M3 discharges the charges of the gate G1 to the OUT terminal. If the load is shorted, the OUT terminal is grounded to the ground voltage GND, so the same operation is performed.

Figure 13:
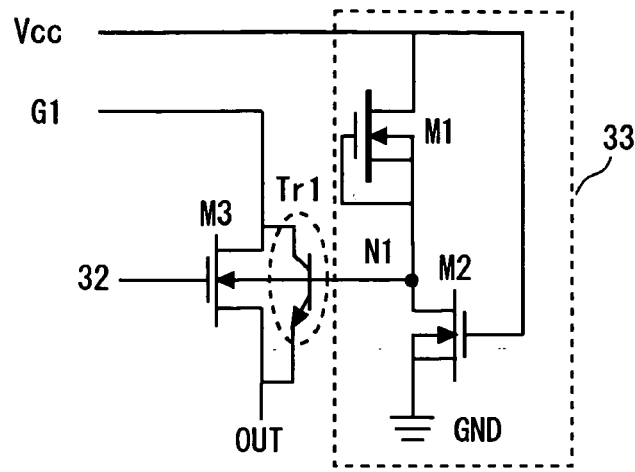
FIG. 13 is a circuit diagram depicting the second detection circuit according to the present invention.
Figure 14:
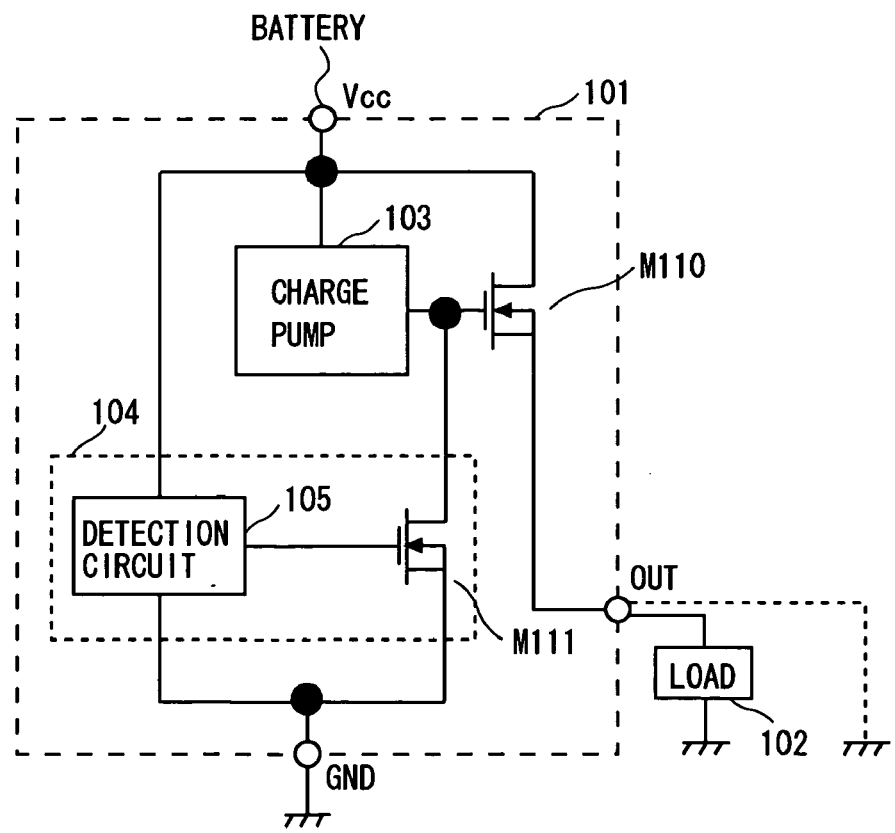
FIG. 14 is a circuit diagram depicting a conventional power device.
Figure 15:
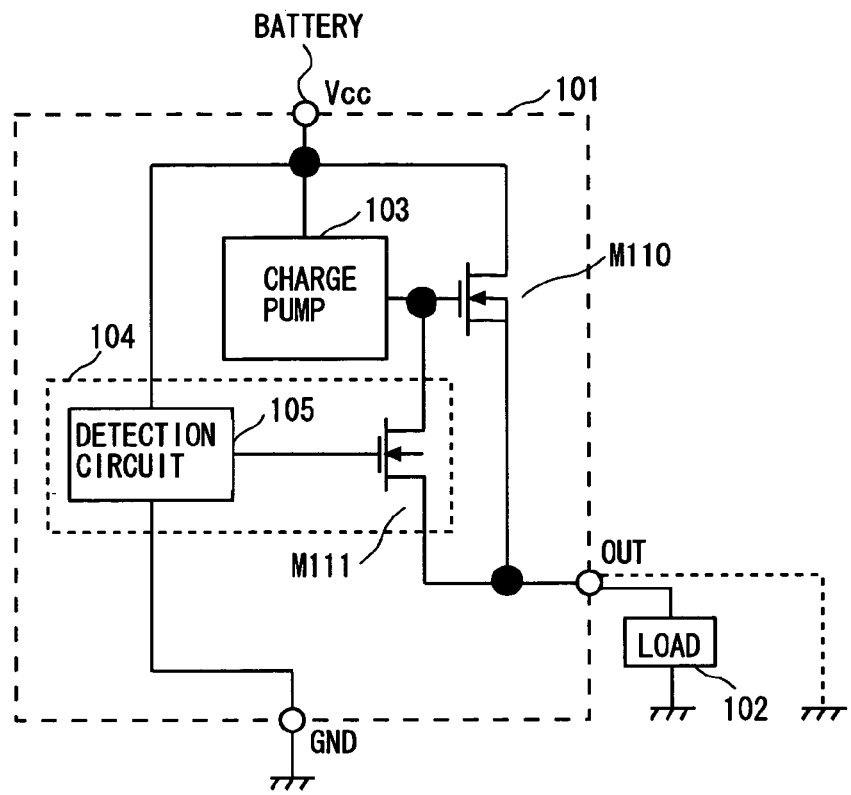
FIG. 15 is a circuit diagram depicting a conventional power device.
Figure 16:
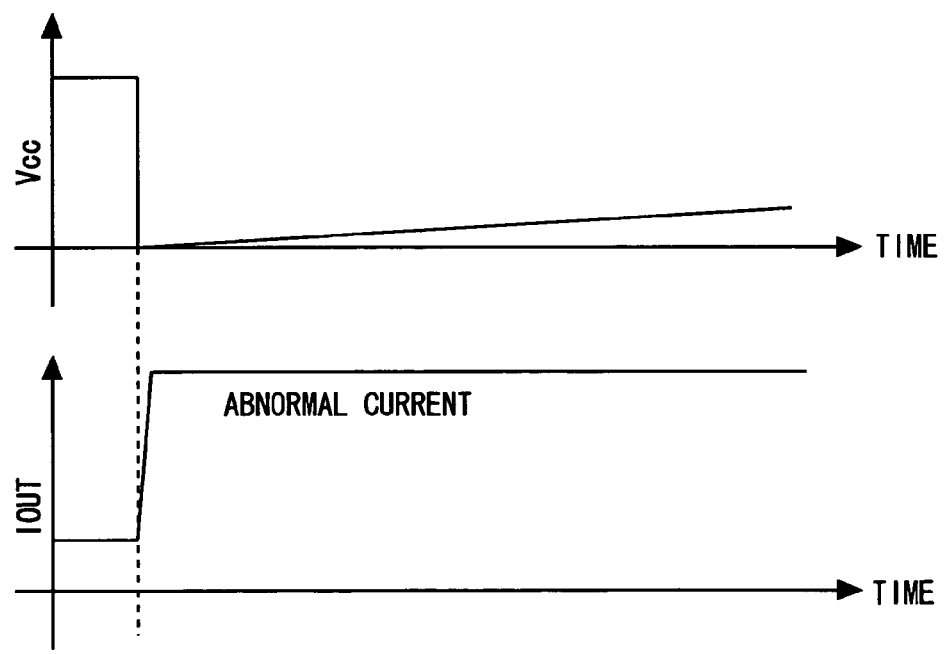
FIG. 16 is a timing chart depicting a conventional power device.

FIG. 13 is a circuit diagram depicting the configuration of the second detection circuit 33 according to the present embodiment. In FIG. 13, composing elements the same as FIG. 5 are denoted with the same reference symbols, and description thereof will be omitted. The operation of the power device using the second detection circuit 33 is the same as FIG. 6.

In the present embodiment, the source of the MOS transistor M3 connected to the second detection circuit 33 is not connected to the GND terminal, but to the OUT terminal. In other words, when an over current is generated, the parasitic transistor Tr1 performs bi-polar operation or the MOS transistor M3 turns ON, so that the charges of the gate G1 are discharged to the OUT terminal.

By this configuration, the parasitic transistor protects the output MOS transistor from an over current. In particular, even if the over current protection circuit has a configuration such that the gate charges are discharged from the gate of the output MOS transistor to the OUT terminal, the present invention can be applied.

Embodiment 6

A power device according to Embodiment 6 of the present invention is now described. The power device of this embodiment is the same as Embodiment 1 except the configuration of the second detection circuit 33 of FIG. 5 and hence, the following description is focused on a gate discharge circuit.

Figure 8:
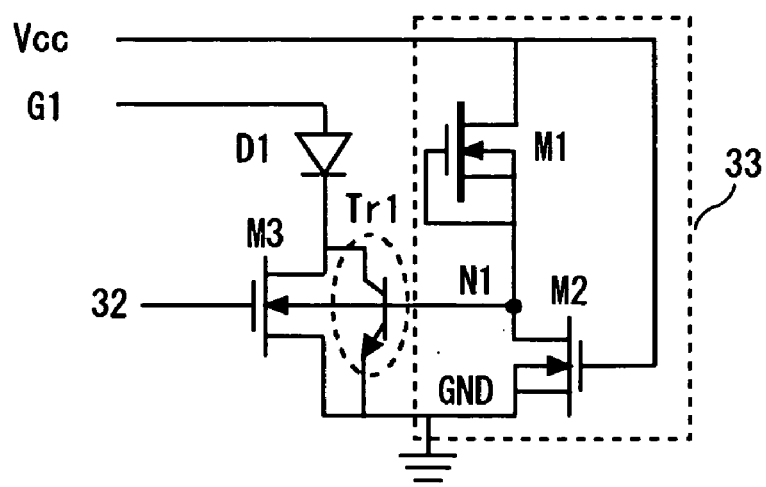
FIG. 8 is a circuit diagram depicting the second detection circuit according to the present invention.

FIG. 8 is a circuit diagram showing the configuration of the second detection circuit 33 according to this embodiment. In FIG. 8, the same components as those of FIGS. 5 and 7 are denoted by the same reference numerals, so their description is omitted here. The operation of the power device using the second detection circuit 33 is the same as that of FIG. 6.

The second detection circuit 33 of this embodiment includes, in addition to the components of FIG. 7, a diode D1 inserted between the gate G1 of the output MOS transistor M0 and the MOS transistor M3. The diode D1 has an anode connected to the gate G1 of the output MOS transistor M0 and a cathode connected to a drain of the MOS transistor M3.

The diode D1 prevents backflow of current between the gate G1 and the ground terminal (ground voltage GND). That is, the diode D1 allows current to flow from the gate G1 to the MOS transistor M3 but inhibits current to flow from the MOS transistor M3 to the gate G1.

In some cases, the voltage of the gate G1 is higher than the voltage of the GND terminal. For example, a single ECU is provided with plural power devices, one of which serves as a high side switch, and the rest of which act as low side switches. The power devices are commonly connected to the GND terminal. With this configuration, when the low side switches are turned ON, the potential of the GND terminal is unequal to the ground voltage GND even if the high side switch is turned OFF. The voltage of the GND terminal then is equivalent to that of a wiring resistance between the GND terminal and the chassis 6, for example, 2 V. The ground voltage GND on a side where the load 4 is grounded, and the potential of the gate G1 are equivalent to the voltage of the chassis 6, for example, 0 V. In this case, the diode D1 prevents the backflow of the current in the order of the GND terminal, the MOS transistor M2, the node N1, the parasitic transistor Tr1, and the gate G1.

This circuit configuration protects the output MOS transistor against the over current using the parasitic transistor, and suppresses the backflow of current from the GND terminal and avoids an erroneous operation through the provision of the diode between the gate of the output MOS transistor and the gate discharge MOS transistor.

Other Embodiments

In the above examples, an MOS transistor for over current protection was used as the MOS transistor constituting a parasitic transistor, but the present invention is not limited to this, but an MOS transistor for other applications may be used. For example, an MOS transistor of which the gate and the source are connected and which always turns OFF may be used.

In the above examples, the power device was described as a high side switch, but the present invention is not limited to this, but a low side switch may be used by installing the power device at the ground voltage GND side, not the load side. In this case, an over current is generated if the load is shorted between the battery and the power device.

It is apparent that the present invention is not limited to the above embodiment, that may be modified and changed without departing from the scope and spirit of the invention.

What is claimed is:

1. A semiconductor device, comprising:
an output transistor connected between a first power supply terminal and an output terminal, and passing an output current in accordance with a signal applied to a current control terminal thereof;
an over current protection element connected between the current control terminal and a second power supply terminal;
a first detection circuit applied with a voltage through the first power supply terminal, detecting a current flowing through the output transistor to provide a detection signal to a first control terminal of the over current protection element; and
a second detection circuit applied with a voltage through the first power supply terminal, detecting a current flowing through the output transistor to provide a detection signal to a second control terminal of the over current protection element, and operating at a voltage lower than the first detection circuit.

2. The semiconductor device according to claim 1, wherein the over current protection element is a first MOS transistor including a gate connected to the first control terminal and a substrate connected to the second control terminal.

3. The semiconductor device according to claim 2, wherein:
the second detection circuit includes a resistance element and a second MOS transistor connected in series between the first power supply terminal and the second power supply terminal; and
a series-connection node between the resistance element and the second MOS transistor is connected to the substrate of the first MOS transistor.

4. The semiconductor device according to claim 2, wherein the first detection circuit includes a control circuit connected between the first power supply terminal and the second power supply terminal, and an output terminal of the control circuit is connected to the gate of the first MOS transistor.

5. The semiconductor device according to claim 3, wherein the first detection circuit includes a control circuit connected between the first power supply terminal and the second power supply terminal, and an output terminal of the control circuit is connected to the gate of the first MOS transistor.

6. The semiconductor device according to claim 1, wherein when an over current flows through the output transistor due to the output terminal short-circuited to the second power supply terminal, the second detection circuit provides a detection signal to the over current protection to act so as to discharge accumulated charges at the current control terminal and shift the output transistor to a non-operation state, and the first detection circuit starts to operate due to an increase in potential of the first power supply terminal resulting from the shift to the non-operation state to bring the output transistor completely into a non-operation state.

7. The semiconductor device according to claim 2, wherein when an over current flows through the output transistor due to the output terminal short-circuited to the second power supply terminal, the second detection circuit outputs a detection signal to the over current protection to act so as to discharge accumulated charges at the current control terminal and shift the output transistor to a non-operation state, and the first detection circuit starts to operate due to an increase in potential of the first power supply terminal resulting from the shift to the non-operation state to bring the output transistor completely into a non-operation state.

8. The semiconductor device according to claim 3, wherein when an over current flows through the output transistor due to the output terminal short-circuited to the second power supply terminal, the second detection circuit outputs a detection signal to the over current protection to act so as to discharge accumulated charges at the current control terminal and shift the output transistor to a non-operation state, and the first detection circuit starts to operate due to an increase in potential of the first power supply terminal resulting from the shift to the non-operation state to bring the output transistor completely into a non-operation state.

9. The semiconductor device according to claim 3, wherein the resistance element is a depletion-type MOS transistor.

10. The semiconductor device according to claim 3, further comprising a constant voltage source provided between the first power supply terminal and a gate of the second MOS transistor.

11. The semiconductor device according to claim 3, further comprising a third MOS transistor connected to a gate of the second MOS transistor and having substantially the same structure as the second MOS transistor.

12. The semiconductor device according to claim 1, further comprising a diode inserted between the current control terminal and the over current protection element and preventing backflow of a current.

13. The semiconductor device according to claim 3, wherein a plurality of wells are located on a main surface of a semiconductor substrate in an isolated form, and the first MOS transistor and the second MOS transistor are located in different wells.

14. The semiconductor device according to claim 1, wherein the over current protection element is connected to the second power supply terminal through the output terminal.

15. The semiconductor device according to claim 1, wherein the output transistor is an N-channel type MOS transistor.

16. The semiconductor device according to claim 1, wherein an external load is connected between the output terminal and the second power supply terminal, and the first power supply terminal has a potential higher than a potential of the second power supply terminal.

* * * * *